(12) United States Patent
Dobyns et al.

(10) Patent No.: US 8,461,850 B2
(45) Date of Patent: Jun. 11, 2013

(54) TIME-DOMAIN MEASUREMENTS IN A TEST AND MEASUREMENT INSTRUMENT

(75) Inventors: Kenneth P. Dobyns, Beaverton, OR (US); Gary J. Waldo, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 255 days.

(21) Appl. No.: 12/856,483

(22) Filed: Aug. 13, 2010

(65) Prior Publication Data

US 2012/0038369 A1 Feb. 16, 2012

(51) Int. Cl.
*G01R 27/28* (2006.01)
(52) U.S. Cl.
USPC ............................. 324/617; 324/618; 324/535
(58) Field of Classification Search
USPC ................................ 324/617, 618, 535, 76.22
See application file for complete search history.

(56) References Cited

U.S. PATENT DOCUMENTS

| | | | | |
|---|---|---|---|---|
| 5,499,391 A | * | 3/1996 | Tsui | 455/226.2 |
| 6,026,418 A | * | 2/2000 | Duncan, Jr. | 708/309 |
| 7,298,129 B2 | * | 11/2007 | Bernard | 324/76.22 |

* cited by examiner

*Primary Examiner* — Vincent Q Nguyen
(74) *Attorney, Agent, or Firm* — Marger Johnson & McCollom, P.C.; Thomas F. Lenihan

(57) ABSTRACT

A test and measurement instrument and method for receiving a radio frequency (RF) signal, digitizing the RF signal using an analog-to-digital converter, downconverting the digitized signal to produce I (in-phase) and Q (quadrature) baseband component information, generating one or more IQ-based time-domain traces using the I and Q baseband component information, and measuring and displaying a variety of measurement values of the IQ-based time-domain traces. The IQ-based time-domain measurement values can be automatically generated and displayed, and/or transmitted to an external device.

15 Claims, 5 Drawing Sheets

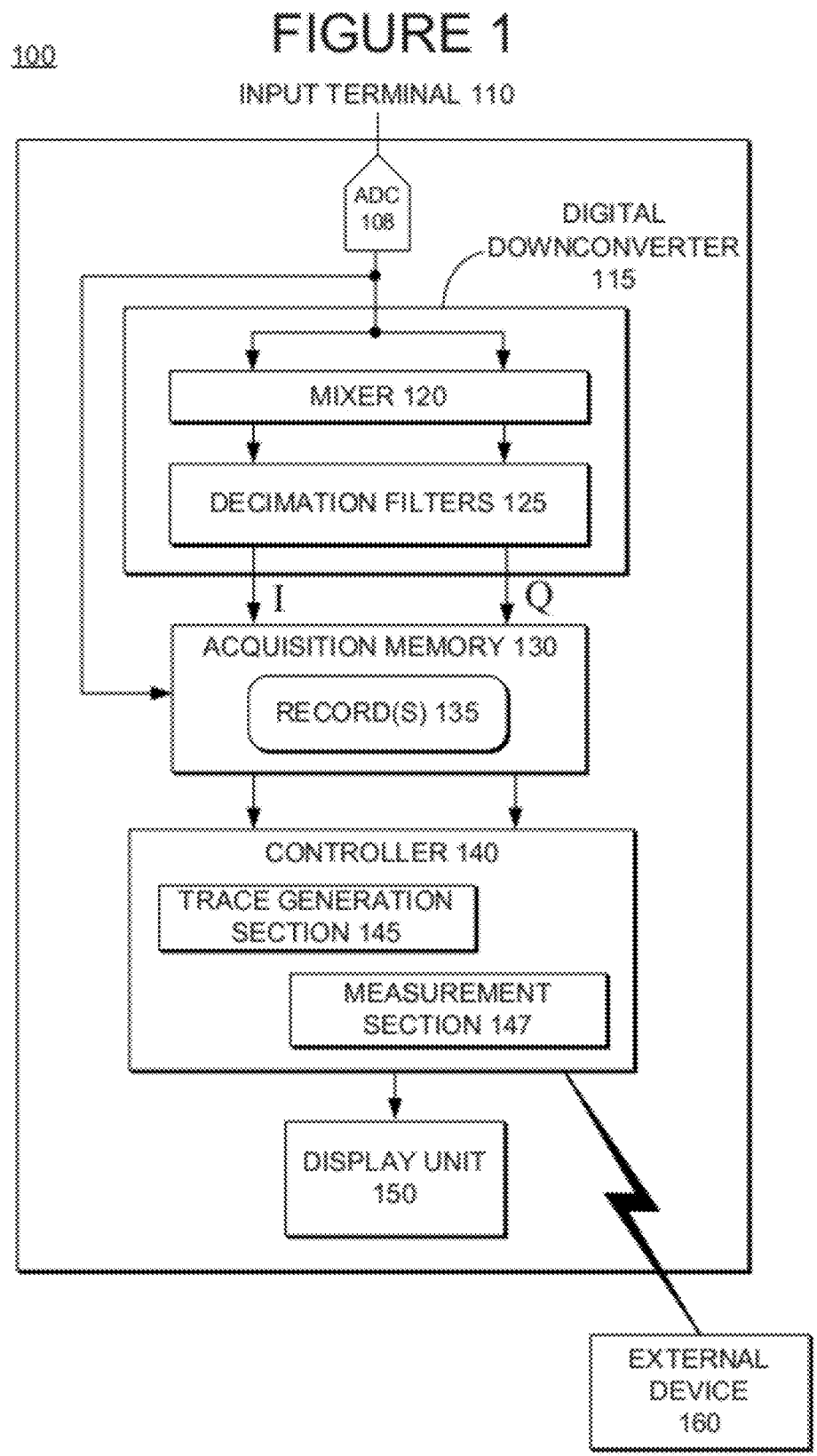

MEASUREMENT VALUE(S) 230
- FREQUENCY OF FREQUENCY VS. TIME TRACE
- PULSE WIDTH OF FREQUENCY VS. TIME TRACE
- DELAY WITH RESPECT TO CONTROL TRACE
- RISE TIME OF FREQUENCY VS. TIME TRACE
- FALL TIME OF FREQUENCY VS. TIME TRACE
- OVERSHOOT OF FREQUENCY VS. TIME TRACE
- SLEW RATE OF FREQUENCY VS. TIME TRACE
- ETC.

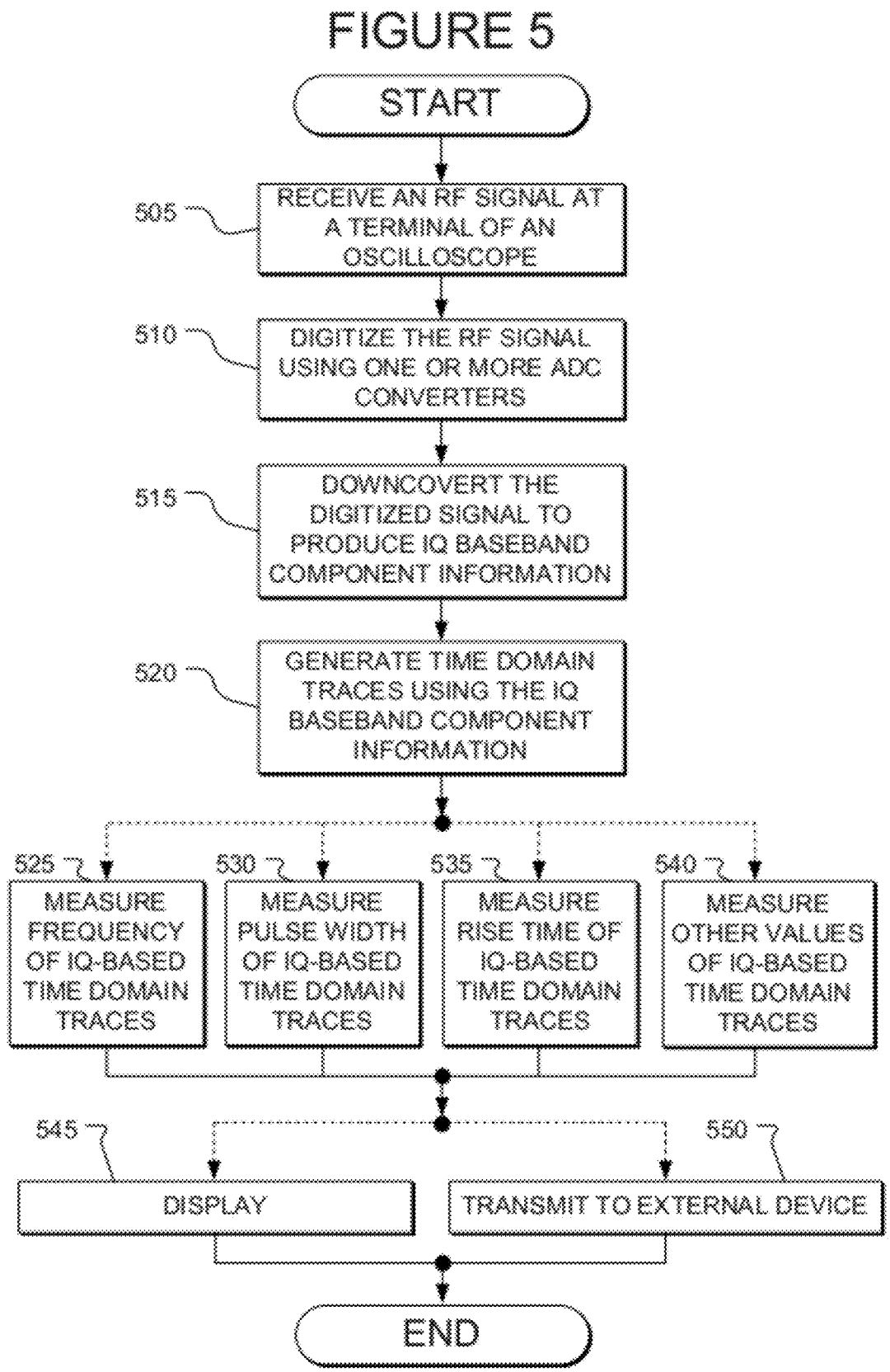

TIME-DOMAIN MEASUREMENTS IN A TEST AND MEASUREMENT INSTRUMENT

BACKGROUND

Radio Frequency (RF) transmissions are becoming increasingly ubiquitous in today's wirelessly connected world. For instance, cell phone usage is rapidly increasing around the world, high-speed data networks are spreading, and home wireless and wide-area networks are becoming commonplace. In the midst of these and other similar advances, now more than ever, it is crucial that test and measurement instruments provide useful features and interfaces so that an accurate picture of what is happening can be constructed and provided to field personnel such as test engineers and other qualified technicians.

RF carrier signals can transmit information in a variety of ways based on variations in the amplitude, frequency, or phase of the carrier. Governments typically apportion radio frequency ranges to be used for different purposes. As a result, certain devices are permitted to operate only within predetermined bands. Such limitations result in ever more complex and efficient methods for adapting to these constraints and abiding by accepted communications standards. For example, many modern transmission systems use frequency hopping and phase modulation to conform to communication standards and to provide improved functionality and interoperability among different devices competing for similar resources.

Because of the complex nature of these signals, it is difficult or impossible to take accurate measurements of certain aspects of these signals using conventional techniques. While some Real Time Spectrum Analyzers (RTSA) are adept at measuring the generalities of RF signals in the frequency-domain, they are lacking in more specific measurement capabilities, particularly in the time-domain. Demodulation and data decode capabilities, and to some extent, limited single-channel measurements, are available in some RTSAs, but such instruments lack the richness of measurement functionality necessary to understand the totality of the RF signals in a rapidly expanding and multifaceted technological field.

In the presence of random burst lengths, frequency hopping algorithms, phase modulation, signal distortions, and other demanding characteristics of RF signals—existing methods of measuring RF signals, particularly in the time-domain, are deficient. Therefore, it is difficult or impossible to diagnose problems in the signal transmissions or to make complete measurements of the signals.

SUMMARY

Embodiments of the subject invention provide measurement techniques for measuring time-domain characteristics of radio frequency (RF) signals. The subject apparatus, system, and method receive, digitize, and downconvert RF signals to produce I (in-phase) and Q (quadrature) baseband component information from the digitized RF signals. One or more IQ-based time-domain traces are generated using the I and Q baseband component information. Such IQ-based time-domain traces include, for example, a frequency-versus-time trace, a phase-versus-time trace, an amplitude (i.e., a power-versus-time) trace, an I-versus-time trace, and/or a Q-versus-time trace.

In some example embodiments, a measurement section of the test and measurement instrument produces measurement values corresponding to attributes of the IQ-based time-domain traces, such as a frequency of an IQ-based time-domain trace, a pulse width of the IQ-based time-domain trace, a delay between the IQ-based time-domain trace and another signal, rise and fall times of the IQ-based time-domain trace, among a variety of other suitable measurements, which can be made on time-domain waveforms. For example, the measurement section may produce a frequency of the frequency hops in a frequency-versus-time trace and display the measurement value on a display unit of the test and measurement instrument, or otherwise transmit the measurement value to an external computer or memory device. In general, the measurements correspond to characteristics of the signal, and are made on the overall time-domain record, either at the beginning of an acquired record or at multiple places in the record. The measurements can be made one at a time, or in any combination. A variety of measurement values can be applied to the IQ-based time-domain trace, as is more fully described below.

BRIEF DESCRIPTION OF THE DRAWINGS

FIG. 1 illustrates a block diagram of a test and measurement instrument including an analog-to-digital converter (ADC), a digital downconverter, a controller including a trace generation section and a measurement section, and a display unit, according to an example embodiment of the invention.

FIG. 5 is a flow diagram illustrating a technique for measuring IQ-based time-domain traces according to some embodiments of the invention.

DETAILED DESCRIPTION

Figures 2A, 2B:
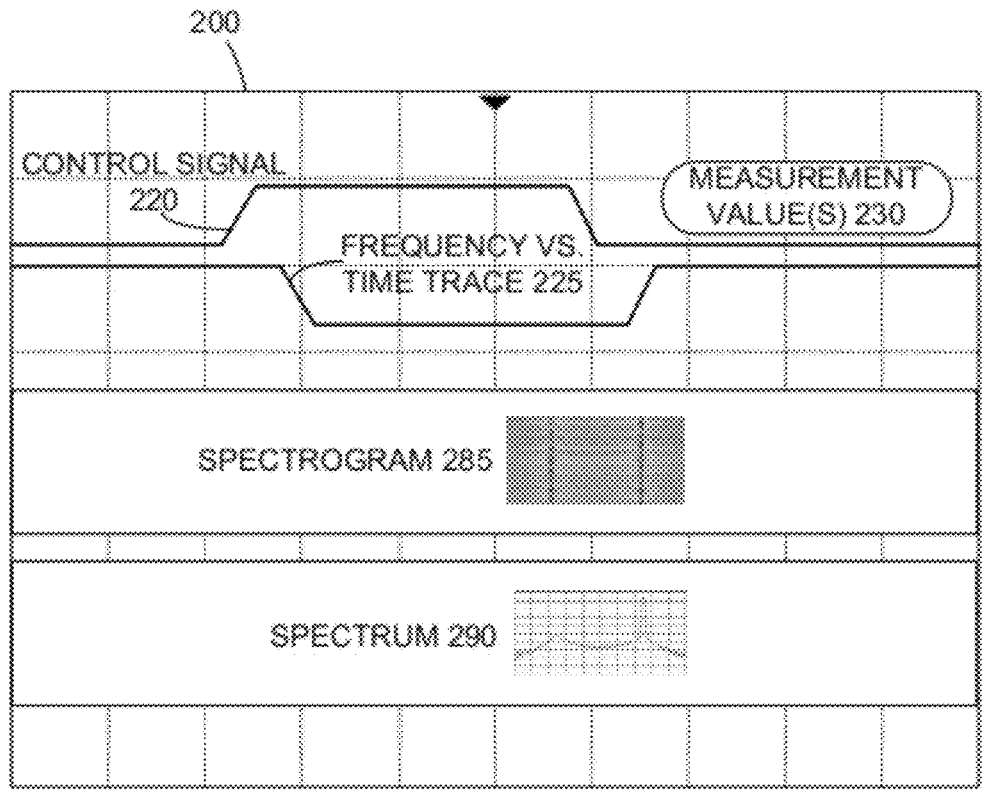
FIGS. 2A-2B illustrate a simplified display including various received or derived signals and traces, such as a frequency-versus-time trace, in accordance with an example embodiment of the invention.

FIG. 1 illustrates a block diagram of a test and measurement instrument 100 including an analog-to-digital converter (ADC) 108, a digital downconverter 115, a controller 140 including a trace generation section 145 and a measurement section 147, and a display unit 150, according to an example embodiment of the invention. The test and measurement instrument 100 can be a digital oscilloscope, a Real Time Spectrum Analyzer (RTSA), or other suitable measurement device. For the sake of brevity and consistency, but not limitation, the test and measurement instrument will generally be referred to herein as an oscilloscope.

The oscilloscope 100 may have multiple channels or inputs, such as input terminal 110, suitable for use with various embodiments as described herein. Although the oscilloscope may have a single input terminal 110, inventive aspects described are equally applicable to an oscilloscope having four inputs, or any number of inputs. While components of the oscilloscope 100 are shown to be directly coupled to each other, it should be understood that the oscilloscope 100 can include a variety of other circuit or software components, inputs, outputs, and/or interfaces, which are not necessarily shown, but that are disposed between or otherwise associated with the illustrated components of oscilloscope 100.

An electrical signal under test, preferably an RF signal, is received at the input terminal 110. The RF signal can be converted to an analog intermediate frequency (IF) signal that is filtered prior to being digitized by an ADC 108. However, reference herein will generally be made to an "RF signal" or "RF signals" and it should be understood that such reference can include one or more RF signal, or, one or more IF signal derived from the RF signal.

The ADC 108 is structured to digitize the RF signal under test. The digital downcoverter 115 is operatively coupled to the ADC 108, receives the digitized RF signal, and produces I (in-phase) and Q (quadrature) baseband component data or signals from the digitized RF signal. More specifically, mixer 120 numerically multiplies a sine and cosine with the digitized RF signal, thereby generating the I and Q component information, which contains all of the information present in the original RF signal. The signal component data can thereafter be decimated using the decimation filters 125, which digitally filters and reduces the number of samples and noise associated with the signals.

An acquisition memory 130 is operatively coupled to the digital downconverter 115 and is configured to acquire and store one or more records 135 of the digitized I and Q baseband component information associated with the RF signal. In other words, the acquisition memory 130 can receive the I and Q baseband component information from the digital downconverter 115 and store it. In some embodiments, the digitized data output by the ADC 108 may be stored directly to a memory first, such as memory 130, and then accessed by the downconverter 115 to produce the I and Q baseband component information. Each input terminal 110 of the oscilloscope can have associated therewith a different portion of the acquisition memory 130 or a different record 135 in which the component information is stored. The acquisition memory 130 can be any variety of memory. For example, the acquisition memory 130 can be volatile memory, non-volatile memory, dynamic random-access memory, static memory, or the like.

A controller 140 is operatively coupled to the acquisition memory 130 and receives the I and Q component information. The controller 140 is also coupled to the display unit 150, processes the signals under test, and produces corresponding waveforms, traces, and/or measurements for display by the display unit 150. Alternatively, or in addition to displaying the traces and measurements, the controller 140 can transmit these to an external device 160 via a conductor such as a bus or a wire. The external device 160 can include, for example, a computer separate from the test and measurement instrument, or an external memory device, among other possibilities.

The controller 140 can include a trace generation section 145 and a measurement section 147. The trace generation section 145 generates one or more IQ-based time-domain traces using the I and Q baseband component information. For example, after downconversion, the trace generation section 145 can generate a phase by calculating an arctangent of (Q divided by I), i.e., ARCTAN(Q/I). The trace generation section 145 can also generate a frequency by calculating a derivative with respect to time of the phase, i.e., d/dt (phase). The phase and the frequency are used to plot phase-versus-time and frequency-versus-time traces, respectively. In addition, the trace generation section 145 can generate an amplitude (i.e., power-versus-time) trace, which can be generated, for example, by taking a square-root of the square of I added to the square of Q (e.g., SQRT(I^2+Q^2)). The various traces will be further described in further detail below.

The measurement section 147 produces a measurement value of at least one measurable aspect of the IQ-based time-domain traces. For example, if the IQ-based time-domain trace is a frequency-versus-time trace, then the measurement section 147 can produce the measurement value by measuring the frequency of the frequency hops in a frequency-versus-time trace, thereby determining a frequency modulated hop rate aspect of the signal. As another example, the measurement section 147 can measure a pulse width of the frequency-versus-time trace, thereby determining a frequency modulated hop duration aspect of the signal. In general, the measurements correspond to characteristics of the signal, and are made on the overall time-domain record, either at the beginning of an acquired record, such as record 135 of acquisition memory 130, or at multiple places in the acquired record. The measurements can be made one at a time, or in any combination. Other measurement values, such as those further described below, can also be made on the frequency-versus-time trace. Indeed, a variety of other suitable measurements, which may be known to persons having skill in the art, can be applied to the IQ-based time-domain traces.

In addition, the measurement section 147 can produce a measurement value of at least one measurable aspect of individual traces of the I and Q baseband component information. In other words, measurements can be made directly to a trace of the I baseband component information or to a trace of the Q baseband component information.

The display unit 150 is adapted to display the one or more IQ-based time-domain traces together (i.e., near to or overlapping with one another) with frequency-domain traces such as a spectrum of the RF signal and/or a spectrogram of the RF signal, within a same window of the display unit. The frequency-domain traces such as the spectrum and spectrogram of the RF signal are produced by the application of fast Fourier transform (FFT) algorithms to the I and Q data. When measurement values of the IQ-based time-domain traces are generated, the measurement values can also be displayed within the same display of the display unit in a location that is conveniently viewable to a user of the oscilloscope. In other words, the IQ-based time-domain traces, the IQ-based frequency-domain traces, and the measurement values can be displayed near to one another, in a single window occupying substantially the entire display of the display unit 150.

Reference to the frequency-domain is made herein, and it should be understood that these refer to frequency-domain measurements and/or traces as understood by persons having skill in the art. For example, a spectrum of an RF signal is within the frequency-domain, and typically includes a plot having a horizontal axis representative of the frequency range, and a vertical axis representative of amplitude or signal power for a given frequency. In addition, a spectrogram of an RF signal is considered to be within the frequency-domain and typically includes a plot having a horizontal axis representative of the frequency range, a vertical axis representative of time, and the amplitude represented by varying colors of the trace.

Conversely, the time-domain includes different types of measurements and/or traces. For instance, a frequency-versus-time measurement and/or trace is understood to be within the time-domain rather than the frequency-domain, and is understood to have a horizontal axis representative of time, and a vertical axis representative of frequency. The frequency-versus-time measurement has a superior time-domain resolution than the spectrogram.

Similar to frequency-versus-time, a power-versus-time trace shows how the power of a signal changes over time, and is understood to be within the time-domain; the horizontal axis is representative of time, and the vertical axis is representative of power—typically on a log scale instead of voltage on a linear scale. In addition, a phase-versus-time measurement and/or trace is displayed as a function of time, and is understood to be within the time-domain; the horizontal axis is representative of time, and the vertical axis is representative of the range of phase values. Reference is made herein to IQ-based time-domain traces, which refer to signals and/or traces derived from I and Q component information or data, but within the time-domain, as contrasted with the frequency-domain.

Any of the ADC 108, the digital downconverter 115, the controller 140 including the trace generation and measurement sections, and the display unit 150 may exist in or be implemented using hardware, software, firmware, or by any combination thereof.

FIGS. 2A-2B illustrate a simplified display 200 including various received or derived signals and traces, such as a frequency-versus-time trace 225, in accordance with an example embodiment of the invention.

As illustrated in FIG. 2A, the upper portion of display 200 includes an example control signal 220 and a frequency-versus-time trace 225. Although shown in the upper portion of display 200, it should be understood that the signals and traces can be located in any area of the display. In addition, while the signal 220 is referred to as a "control" signal, in some embodiments this signal can be any signal, such as a time-domain signal, received or generated by the test and measurement instrument. Multiple terminals 110 of the oscilloscope can be used to simultaneously receive various signals such as an RF signal and the control signal 220, and traces such as the frequency-versus-time trace 225 can be derived from information associated with the received signals.

In some embodiments, the control signal 220 can indicate a transition in frequency, and the frequency-versus-time trace 225 reflects the transitions. In some embodiments, there need not be a cause and effect relationship between the signals and/or traces; for example, a measurement can be taken between a time-domain signal (i.e., unrelated to the control signal 220) and the frequency-versus-time trace 225.

The measurement section 147 (of FIG. 1) can produce one or more measurement values 230 associated with the frequency-versus-time trace. For instance, the measurement section 147 can produce a frequency measurement value of the frequency hops in a frequency-versus-time trace, and display the measurement value on the display 200. The measurement section 147 can produce a variety of additional measurement values 230 as shown, as examples, in FIG. 2B, such as a pulse width of a pulse of the frequency-versus-time trace, a delay between the control signal and the frequency-versus-time trace, a rise time of a pulse or portion of the frequency-versus-time trace, a fall time of a pulse or portion of the frequency-versus-time trace, an overshoot condition of the frequency-versus-time trace, a slew rate of the frequency-versus-time trace, and so forth. Indeed, a variety of other suitable measurements, which may be known to persons having skill in the art, can be applied to the frequency-versus-time trace. In addition, the controller 140 can transmit the measurement values 230 to the external device 160 via a conductor such as a bus or wire.

Moreover, a spectrogram 285 and/or a spectrum 290 in the frequency-domain can be displayed together (i.e., near to or overlapping with one another) with the frequency-versus-time trace in the time-domain, and together with the control signal and the measurement values, in a single window 200 occupying substantially the entire display 200 of the display unit 150. In other words, the spectrogram 285 and spectrum 290 are not displayed in separate displays from the other signals and traces, which would otherwise make it difficult to correlate information between the signals. Rather, information from the spectrogram 285 and/or spectrum 290 in the frequency-domain can be correlated or associated with information from the time-domain traces such as the frequency-versus-time trace 225 and measurement values 230 within the same display.

In some embodiments, the measurement section 147 can automatically produce a plurality of measurement values of the frequency-versus-time trace responsive to a selection by the user, and automatically display the measurement values 230 on the display 200 for further analysis by the user. For example, a frequency modulated hop rate and hop duration can be automatically determined responsive to user input by automatically measuring the frequency of the frequency hops in a frequency-versus-time trace and the pulse width of the frequency-versus-time trace, and displaying such measurement values so that the user can observe them. Other measurements such as the delay with respect to the control signal can also be automatically determined and displayed. It should be understood that any of the measurement techniques and values discussed above can be automatically measured and displayed by the oscilloscope 100.

Figure 3:
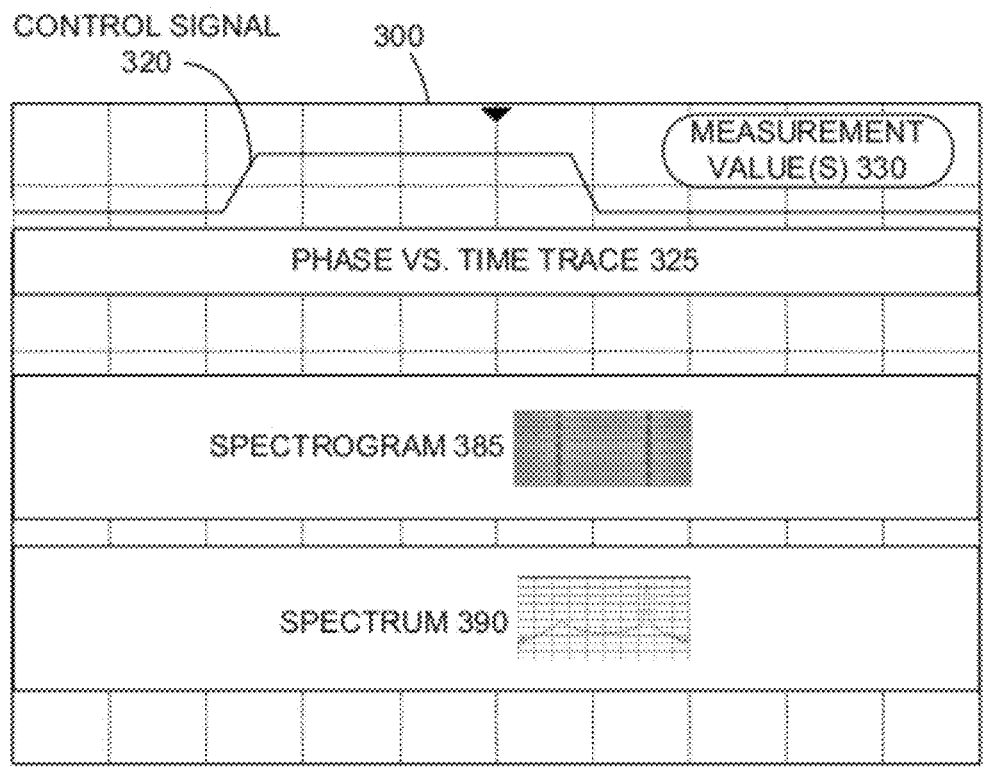
FIG. 3 illustrates a simplified display including various received or derived signals and traces, such as a phase-versus-time trace, in accordance with an example embodiment of the invention.

FIG. 3 illustrates a simplified display 300 including various received or derived signals and traces, such as a phase-versus-time trace 325, in accordance with an example embodiment of the invention.

As illustrated in FIG. 3, the upper portion of display 300 includes control signal 320 and a phase-versus-time trace 325. Although shown in the upper portion of display 300, it should be understood that the signals and traces can be located in any area of the display. In addition, while the signal 320 is referred to as a "control" signal, in some embodiments this signal can be any signal, such as time-domain signal, received or generated by the test and measurement instrument. Multiple terminals 110 of the oscilloscope can be used to simultaneously receive various signals such as an RF signal and the control signal 320, and traces such as the phase-versus-time trace 325 can be derived from information associated with the received signals.

The control signal 320 can indicate a transition in phase or some other characteristic of the RF signal. In some embodiments, there need not be a cause and effect relationship between the signals and/or traces; for example, a measurement can be taken between a time-domain signal (i.e., unrelated to the control signal 320) and the phase-versus-time trace 325.

The measurement section 147 (of FIG. 1) can produce one or more measurement values 330 associated with the phase-versus-time trace. For instance, the measurement section 147 can produce measurement values 330, which are similar to or otherwise correspond to measurement values 230 described above, but applied to the phase-versus-time trace 325. The measurement values 330 can be displayed on the display 300 or transmitted to the external device 160 via a conductor such as a bus or wire. Indeed, a variety of other suitable measurements, which may be known to persons having skill in the art, can be applied to the phase-versus-time trace.

Moreover, a spectrogram 385 and/or a spectrum 390 in the frequency-domain can be displayed together (i.e., near to or overlapping with one another) with the phase-versus-time trace 325 in the time-domain, and together with the control signal 320 and the measurement values 330, in a single window 300 occupying substantially the entire display 300 of the display unit 150. In other words, the spectrogram 385 and spectrum 390 are not displayed in a separate display from the other signals and traces, which would otherwise make it difficult to correlate information between the signals. Rather, information from the spectrogram 385 and/or spectrum 390 in the frequency-domain can be correlated or associated with information from the time-domain traces such as the phase-versus-time trace 325 and measurement values 330 within the same display.

In some embodiments, the measurement section 147 can automatically produce a plurality of measurement values of the phase-versus-time trace responsive to a selection by the user, and automatically display the measurement values 330 on the display 300 for further analysis by the user. For example, the delay between a control input and the phase modulated output of a circuit can be determined by measuring the delay between the control signal 320 and the phase-versus-time trace 325. These measurements can also be automatically determined and displayed. It should be understood that any of the measurement techniques and values discussed above can be used to measure characteristics of the phase-versus-time trace, automatically measured, and/or displayed by the oscilloscope 100.

Figure 4:
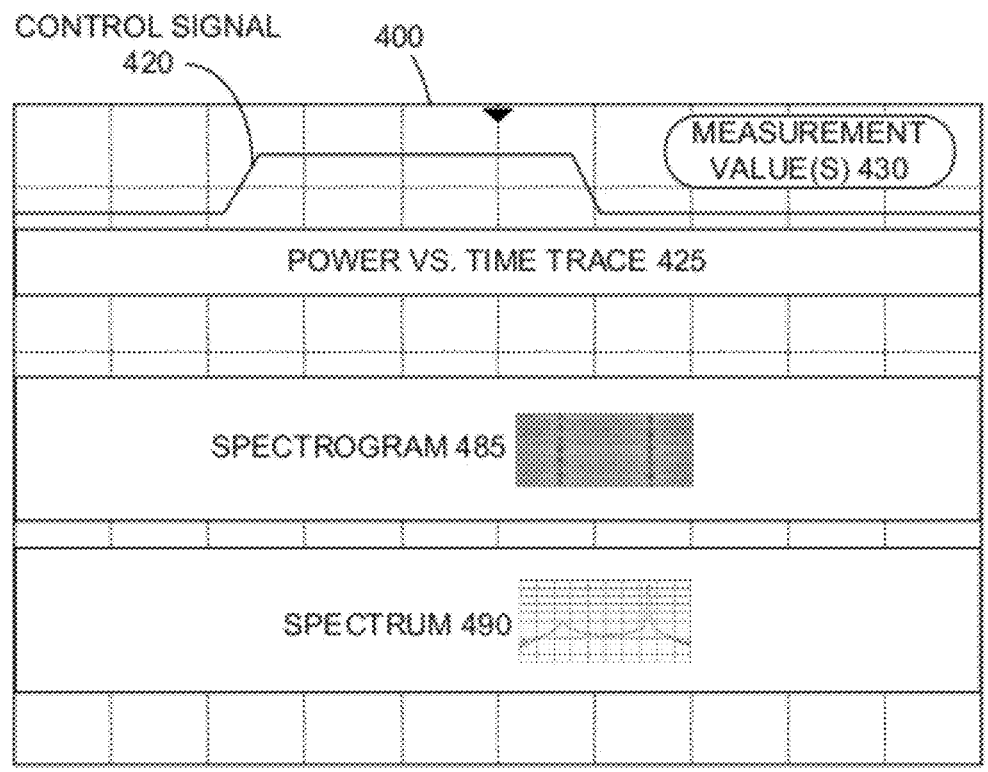
FIG. 4 illustrates a simplified display including various received or derived signals and traces, such as a power-versus-time trace, in accordance with an example embodiment of the invention.

FIG. 4 illustrates a simplified display 400 including various received or derived signals and traces, such as a power-versus-time trace 425, in accordance with an example embodiment of the invention.

As illustrated in FIG. 4, the upper portion of display 400 includes control signal 420 and an amplitude (i.e., power-versus-time) trace 425. Although shown in the upper portion of display 400, it should be understood that the signals and traces can be located in any area of the display. In addition, while the signal 420 is referred to as a "control" signal, in some embodiments this signal can be any signal, such as a time-domain signal, received or generated by the test and measurement instrument. Multiple terminals 110 of the oscilloscope can be used to simultaneously receive various signals such as an RF signal and the control signal 420, and traces such as the power-versus-time trace 425 can be derived from information associated with the received signals.

The control signal 420 can indicate a transition in power or some other characteristic of the RF signal. In some embodiments, there need not be a cause and effect relationship between the signals and/or traces; for example, a measurement can be taken between a time-domain signal (i.e., unrelated to the control signal 420) and the power-versus-time trace 325.

The measurement section 147 (of FIG. 1) produces one or more measurement values 430 associated with the power-versus-time trace. For instance, the measurement section 147 can produce measurement values 430, which are similar to or otherwise correspond to measurement values 230 described above, but applied to the power-versus-time trace. The measurement values 430 can be displayed on the display 400 or transmitted to the external device 160 via a conductor such as a bus or wire. Indeed, a variety of other suitable measurements, which may be known to persons having skill in the art, can be applied to the power-versus-time trace.

Moreover, a spectrogram 485 and/or a spectrum 490 in the frequency-domain can be displayed together with the power-versus-time trace 425 in the time-domain, and together with the control signal 420 and the measurement values 430, in a single window 400 occupying substantially the entire display 400 of the display unit 150. In other words, the spectrogram 485 and spectrum 490 are not displayed in a separate display from the other signals, which would otherwise make it difficult to correlate information between the signals. Rather, information from the spectrogram 485 and/or spectrum 490 in the frequency-domain can be correlated or associated with information from the time-domain traces such as the power-versus-time trace 425 and measurement values 430 within the same display.

In some embodiments, the measurement section 147 can automatically produce a plurality of measurement values of the power-versus-time trace responsive to a selection by the user, and automatically display the measurement values 430 on the display 400 for further analysis by the user. These measurements can also be automatically determined and displayed. It should be understood that any of the measurement techniques and values discussed above can be used to measure characteristics of the power-versus-time trace, automatically measured, and/or displayed by the oscilloscope 100.

FIG. 5 is a flow diagram illustrating a technique for measuring IQ-based time-domain traces according to some embodiments of the invention. The technique begins at 505 where an RF signal is received at a terminal of a test and measurement instrument such as an oscilloscope. An ADC is used to digitize the RF signal at 510. The flow then proceeds to 515 where the digitized signals are downconverted to produce I and Q baseband component information or data. At 520, time-domain traces using the IQ baseband component information are generated. The flow can then proceed along any one of several paths, such as to 525 where a frequency of the IQ-based time-domain traces is measured, to 530 where a pulse width of a pulse of the IQ-based time-domain traces is measured, to 535 where a rise time of a pulse of the IQ-based time-domain traces is measured, or to 540 where other values of the IQ-based time-domain traces are measured. The other values can include any of the measurement values discussed above with reference to FIGS. 1-4, and for the sake of brevity, will not be repeated. The flow then proceeds to 545 and/or 550 where the measurement values are displayed on the display unit 150 of the oscilloscope for observation and analysis by the user, and/or transmitted to external device 160 (of FIG. 1) for further processing or analysis.

Although particular embodiments have been described, it will be appreciated that the principles of the invention are not limited to those embodiments. For example, while the embodiments mentioned above describe different properties of waveforms, the properties described above do not tend to be statistical like the properties associated with jitter measurements; however, the embodiments disclosed are not limited to non-statistical properties, but rather, can extend to jitter measurements and the like or other types of statistical measurements. For instance, further analysis can be performed on the measurements such as statistics, histograms, etc. Statistical values such as minimum, maximum, mean, average, standard deviation, and so forth, can be applied to the measurements. It should be understood that other analysis types can include trend plots of measurement values, histograms, and so forth.

In some embodiments, an article drawn from the set including floppy disks, optical disks, fixed disks, volatile memory, non-volatile memory, random access memory, read-only memory, or flash memory, comprising a machine-accessible medium having associated instructions that, when executed in a test and measurement device, results in a machine performing the steps of the various embodiments of the invention as disclosed herein. Other variations and modifications may be made without departing from the principles of the invention as set forth in the following claims.

The invention claimed is:

1. A test and measurement instrument, comprising:
   an input terminal to receive an electrical signal under test;
   an analog-to-digital converter (ADC) to digitize the signal under test;

a digital downconverter to produce I (in-phase) and Q (quadrature) baseband component information from the digitized signal;

a trace generation section to generate one or more IQ-based time-domain traces using the I and Q baseband component information; and a measurement section to produce one or more measurement values corresponding to attributes of the one or more IQ-based time-domain traces; wherein the one or more IQ-based time-domain traces includes a frequency-versus-time trace; and the measurement section is configured to measure the frequency of frequency hops in the frequency-versus-time trace, thereby determining a frequency modulated hop rate aspect of the signal under test.

2. The test and measurement instrument of claim 1, wherein:
the one or more IQ-based time-domain traces includes a frequency-versus-time trace; and
the measurement section is configured to measure a pulse width of the frequency-versus-time trace, thereby determining a frequency modulated hop duration aspect of the signal under test.

3. The test and measurement instrument of claim 1, wherein the test and measurement instrument is also configured to receive a second signal.

4. The test and measurement instrument of claim 3, wherein:
the one or more IQ-based time-domain traces includes a frequency-versus-time trace; and
the measurement section is configured to measure a delay between the second signal and the frequency-versus-time trace.

5. The test and measurement instrument of claim 1, wherein:
the one or more IQ-based time-domain traces includes a phase-versus-time trace; and
the measurement section is configured to produce the one or more measurement values corresponding to attributes of the phase-versus-time trace.

6. The test and measurement instrument of claim 1, wherein:
the one or more IQ-based time-domain traces includes a power-versus-time trace; and
the measurement section is configured to produce the one or more measurement values corresponding to attributes of the power-versus-time trace.

7. The test and measurement instrument of claim 1, further comprising:
a display unit to receive and display the measurement value.

8. The test and measurement instrument of claim 1, further comprising:
a controller including the trace generation section and the measurement section, wherein the controller is configured to transmit the one or more measurement values to an external device.

9. A method for measuring time-domain traces in a test and measurement instrument, the method comprising:
receiving an electrical signal under test at a terminal of the test and measurement instrument;
digitizing the signal under test using an analog-to-digital converter (ADC);
downcoverting the digitized signal to produce I (in-phase) and Q (quadrature) baseband component information;
generating one or more IQ-based time-domain traces using the I and Q baseband component information; and
automatically producing a plurality of measurement values of the one or more IQ-based time-domain traces; wherein:
generating the one or more IQ-based time-domain traces includes generating a frequency-versus-time trace; and
wherein automatically producing the plurality of measurement values of the one or more IQ-based time-domain traces comprises:
determining a frequency modulated hop rate by measuring a frequency of frequency hops in the frequency-versus-time trace; and
displaying a measurement value on a display unit corresponding to the frequency modulated hop rate.

10. The method of claim 9, further comprising:
transmitting the plurality of measurement values to an external device.

11. The method of claim 9, wherein automatically producing the plurality of measurement values of the one or more IQ-based time-domain traces further comprises:
determining a frequency modulated hop duration by measuring a pulse width of the frequency-versus-time trace; and
displaying a measurement value on the display unit corresponding to the frequency modulated hop duration.

12. The method of claim 9, wherein the terminal comprises a first terminal, the method further comprising:
receiving a second signal at a second terminal of the test and measurement instrument.

13. The method of claim 12, wherein:
generating the one or more IQ-based time-domain traces includes generating a frequency-versus-time trace; and
automatically producing the plurality of measurement values of the one or more IQ-based time-domain traces comprises:
measuring a delay between the second signal and the frequency-versus-time trace; and
displaying the delay measurement on a display unit.

14. The method of claim 9, wherein:
generating the one or more IQ-based time-domain traces includes generating a phase-versus-time trace; and
automatically producing the measurement values includes producing a plurality of measurement values corresponding to attributes of the phase-versus-time trace.

15. The method of claim 9, wherein:
generating the one or more IQ-based time-domain traces includes generating a power-versus-time trace; and
automatically producing the measurement values includes producing a plurality of measurement values corresponding to attributes of the power-versus-time trace.

* * * * *

UNITED STATES PATENT AND TRADEMARK OFFICE
CERTIFICATE OF CORRECTION

PATENT NO. : 8,461,850 B2  
APPLICATION NO. : 12/856483  
DATED : June 11, 2013  
INVENTOR(S) : Kenneth P. Dobyns et al.

Page 1 of 1

It is certified that error appears in the above-identified patent and that said Letters Patent is hereby corrected as shown below:

In the Specification

On column 10, line 5, the word "downcoverting" should read --downconverting--.

Signed and Sealed this
Seventeenth Day of September, 2013

Teresa Stanek Rea
*Deputy Director of the United States Patent and Trademark Office*